(12) United States Patent
Ikeda

(10) Patent No.: US 9,276,569 B2
(45) Date of Patent: Mar. 1, 2016

(54) SEMICONDUCTOR DEVICE

(71) Applicant: Kabushiki Kaisha Toshiba, Minato-ku (JP)

(72) Inventor: Kentaro Ikeda, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/205,852

(22) Filed: Mar. 12, 2014

(65) Prior Publication Data

US 2014/0375372 A1 Dec. 25, 2014

(30) Foreign Application Priority Data

Jun. 25, 2013 (JP) ................................. 2013-133107

(51) Int. Cl.

| H03L 5/00 | (2006.01) |
|---|---|
| H03K 17/0416 | (2006.01) |
| H01L 25/07 | (2006.01) |
| H03K 17/567 | (2006.01) |
| H03K 17/10 | (2006.01) |
| H01L 27/06 | (2006.01) |
| H01L 27/088 | (2006.01) |
| H03K 17/687 | (2006.01) |

(52) U.S. Cl.
CPC ........ *H03K 17/04163* (2013.01); *H01L 25/072* (2013.01); *H03K 17/102* (2013.01); *H03K 17/567* (2013.01); *H01L 27/0629* (2013.01); *H01L 27/0883* (2013.01); *H01L 2224/0603* (2013.01); *H01L 2224/48137* (2013.01); *H01L 2224/48145* (2013.01); *H01L 2224/48247* (2013.01); *H01L 2224/48464* (2013.01); *H01L 2924/12032* (2013.01); *H01L 2924/13091* (2013.01); *H03K 2017/6875* (2013.01); *H03K 2217/0036* (2013.01)

(58) Field of Classification Search
None
See application file for complete search history.

(56) References Cited

U.S. PATENT DOCUMENTS

| 4,317,110 | A | 2/1982 | Hsu | |
|---|---|---|---|---|
| 7,075,284 | B2 * | 7/2006 | Watanabe et al. | 324/76.11 |
| 7,348,826 | B1 | 3/2008 | Klein et al. | |
| 7,719,055 | B1 | 5/2010 | McNutt et al. | |
| 7,939,857 | B1 * | 5/2011 | Wyatt | 257/205 |
| 2002/0139992 | A1 * | 10/2002 | Kumar et al. | 257/134 |
| 2007/0188415 | A1 * | 8/2007 | Inoue | 345/68 |

(Continued)

FOREIGN PATENT DOCUMENTS

| FR | 2 678 772 A1 | 1/1993 |
|---|---|---|
| GB | 2 249 226 A | 4/1992 |

(Continued)

OTHER PUBLICATIONS

Partial European Search Report issued Nov. 4, 2014 in Patent Application No. 14158160.3.

(Continued)

*Primary Examiner* — Cassandra Cox
(74) *Attorney, Agent, or Firm* — Oblon, McClelland, Maier & Neustadt, L.L.P.

(57) ABSTRACT

A semiconductor device according to an embodiment is provided with a normally-off transistor which includes a first source connected to a source terminal, a first drain, and a first gate connected to a gate terminal, and a normally-on transistor which includes a second source connected to the first drain, a second drain connected to a drain terminal, and a second gate connected to the gate terminal.

18 Claims, 12 Drawing Sheets

(56) References Cited

U.S. PATENT DOCUMENTS

| | | |
|---|---|---|
| 2007/0243668 A1 | 10/2007 | Sankin et al. |
| 2009/0201072 A1 | 8/2009 | Honea et al. |
| 2011/0109241 A1* | 5/2011 | Kitamura .................. 315/291 |
| 2011/0169549 A1 | 7/2011 | Wu |
| 2012/0241756 A1 | 9/2012 | Zhang et al. |
| 2012/0262220 A1 | 10/2012 | Springett |
| 2012/0292635 A1 | 11/2012 | Iketani et al. |
| 2013/0020614 A1 | 1/2013 | Lu et al. |
| 2014/0091852 A1* | 4/2014 | Norling et al. ............. 327/409 |
| 2014/0097701 A1* | 4/2014 | Bailey et al. .............. 307/113 |

FOREIGN PATENT DOCUMENTS

| | | |
|---|---|---|
| JP | 2006-324839 A | 11/2006 |
| JP | 2012-212875 | 11/2012 |
| WO | WO 03/009455 A2 | 1/2003 |

OTHER PUBLICATIONS

Won-Ki Park et al., "A Novel Level-Shifter Circuit Design for Display Panel Driver", Circuits and Systems, XP-031113625, Aug. 2006, pp. 391-394.

Extended European Search Report issued Apr. 10, 2015 in Patent Application No. 14158160.3.

Office Action issued May 1, 2015 in Korean Patent Application No. 10-2014-0028286 (with English language translation).

Wataru Saito, et al., "Switching Controllability of High Voltage GaN-HEMTs and the Cascode Connection" Proceedings of the 2012 24th International Symposium on Power Semiconductor Devices and ICS, XP032452808, 2012, pp. 229-232.

* cited by examiner

SEMICONDUCTOR DEVICE

CROSS-REFERENCE TO RELATED APPLICATION

This application is based upon and claims the benefit of priority from Japanese Patent Application No. 2013-133107, filed on Jun. 25, 2013, the entire contents of which are incorporated herein by reference.

FIELD

Embodiments described herein relate generally to a semiconductor device.

BACKGROUND

A group III nitride, for example, GaN (gallium nitride) based semiconductor is expected as a material for a next-generation power semiconductor device. The GaN based semiconductor device has a wide band gap compared to Si (silicon), and can realize a high withstand voltage and a low loss compared to a Si semiconductor device.

A GaN based transistor is generally applied with a high electron mobility transistor (HEMT) structure in which a two-dimensional electronic gas (2DEG) is used as a carrier. A general HEMT is a normally-on transistor which comes to be a conduction state even when a voltage is not applied to a gate. There is a problem in that it is difficult to realize a normally-off transistor which does not come to be the conduction state as long as the voltage is not applied to the gate.

In power circuits handling large power such as several hundreds of voltage to a thousand voltage, a normally-off operation is required for the safety. Therefore, there is proposed a circuit configuration in which the normally-on GaN based transistor and the normally-off Si transistor are connected in cascode to realize the normally-off operation.

However, in such a circuit configuration, a gate voltage of the normally-on GaN based transistor cannot be made sufficiently high. Therefore, there is a problem in that an on-state current does not flow sufficiently.

DETAILED DESCRIPTION

Figure 1:
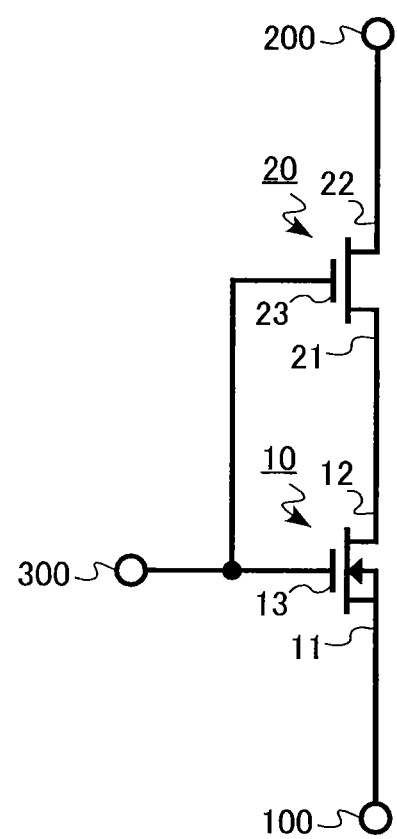
FIG. 1 is a circuit diagram illustrating a semiconductor device according to a first embodiment.

A semiconductor device according to an embodiment is provided with a normally-off transistor which includes a first source connected to a source terminal, a first drain, and a first gate connected to a gate terminal, and a normally-on transistor which includes a second source connected to the first drain, a second drain connected to a drain terminal, and a second gate connected to the gate terminal.

Hereinafter, embodiments will be described with reference to the drawings. Further, in the following descriptions, the same members will be denoted with the same reference numerals, and members once described will not be described again appropriately.

In addition, in the specification, the semiconductor device means a power module in which a plurality of elements such as discrete semiconductors are assembled, or an intelligent power module in which the plurality of elements such as the discrete semiconductors are assembled with driving circuits for driving these elements and with self-protecting functions, or includes all the systems which are provided with the power modules and the intelligent power modules.

In addition, in the specification, the normally-on transistor means a transistor in which a channel comes to be in an on state and current flows between the source and the drain when the source and the gate are at the same potential. In addition, in the specification, the normally-off transistor means a transistor in which the channel comes to be in an off state and the current does not flow between the source and the drain when the source and the gate is at the same potential.

In addition, in the specification, a level shift element means an element which has a function of shifting the voltage between both ends of the element by a predetermined amount. Then, a voltage difference between the both ends of the element will be referred to as a shift voltage.

In addition, in the specification, a GaN based semiconductor is a generic term referring to $Al_xGa_{1-x}N$, $InGa_{1-x}N$, and the like which contain GaN, AlN, InN, or an intermediate composition thereof in a nitride semiconductor.

First Embodiment

The semiconductor device according to the embodiment is provided with a source terminal, a gate terminal, and a drain terminal. Then, the semiconductor device is provided with a normally-off transistor which includes a first source connected to the source terminal, a first drain, and a first gate connected to the gate terminal, and a normally-on transistor which includes a second source connected to the first drain, a second drain connected to the drain terminal, and a second gate connected to the gate terminal.

FIG. 1 is a circuit diagram illustrating the semiconductor device according to the embodiment. The semiconductor device according to the embodiment is, for example, a power module having a rated voltage of 600 V or 1200 V.

The semiconductor device according to the embodiment is configured to include an N-ch normally-off transistor 10 which uses electrons as a carrier and an N-ch normally-on transistor 20 which uses electrons as a carrier, which are connected in series to form the power module. The normally-off transistor 10 is, for example, a vertical metal oxide semiconductor field effect transistor (MOSFET) made of Si (silicon). In addition, the normally-on transistor 20 is, for example, a HEMT made of a GaN (gallium nitride) based semiconductor. The normally-on transistor 20 is provided with a gate insulating film.

Further, the normally-off transistor 10 is provided with a parasitic body diode which is not illustrated.

The normally-off transistor 10 has a low withstand voltage compared to the normally-on transistor 20. The withstand voltage of the normally-off transistor 10 is, for example, within 10 to 30 V. In addition, the withstand voltage of the normally-on transistor 20 is, for example, within 600 to 1200 V.

The semiconductor device is provided with a source terminal 100, a drain terminal 200, and a gate terminal 300. Then, the normally-off transistor 10 includes a first source 11 connected to the source terminal 100, a first drain 12, and a first gate 13 connected to the gate terminal 300.

In addition, the normally-on transistor 20 includes a second source 21 connected to the first drain 12, a second drain 22 connected to the drain terminal 200, and a second gate 23 connected to the gate terminal 300. In general, the second drain 22 of the normally-on transistor 20, to which a voltage higher than that of the second source 21 is applied, is designed for a high withstand voltage. For example, a distance between a gate electrode and a drain electrode is designed to be longer than a distance between the gate electrode and a source electrode.

With such a configuration described above, the semiconductor device according to the embodiment serves as a normally-off transistor which is provided with the source terminal 100, the drain terminal 200, and the gate terminal 300.

In other words, when the semiconductor device is turned off, the source terminal 100 and the gate terminal 300 are fixed to a ground potential. Then, the drain terminal 200 is, for example, supplied with a voltage of 600 to 1200 V. At this time, since a potential difference between the first source 11 and the first gate 13 becomes 0 V equal to or lower than a threshold, the normally-off transistor 10 comes to be in the off state. On the other hand, since a potential of the second source 21 rises and a potential difference between the second source 21 and the second gate 23 becomes the threshold or lower, the normally-on transistor 20 comes to be in the off state. Therefore, the entire semiconductor device comes to be in the off state.

When the semiconductor device is turned on, the source terminal 100 is fixed to the ground potential. Then, the gate terminal 300 is applied with a positive gate voltage, for example, a gate voltage of 5 V to 15 V. At this time, since the potential difference between the first source 11 and the first gate 13 becomes the threshold or higher, the normally-off transistor 10 comes to be in the on state. On the other hand, since the second gate 23 is applied with a positive voltage and the potential difference between the second source 21 and the second gate 23 becomes equal to or higher than the threshold, the normally-on transistor 20 comes to be in the on state. Therefore, the semiconductor device comes to be in the on state.

Figure 2:
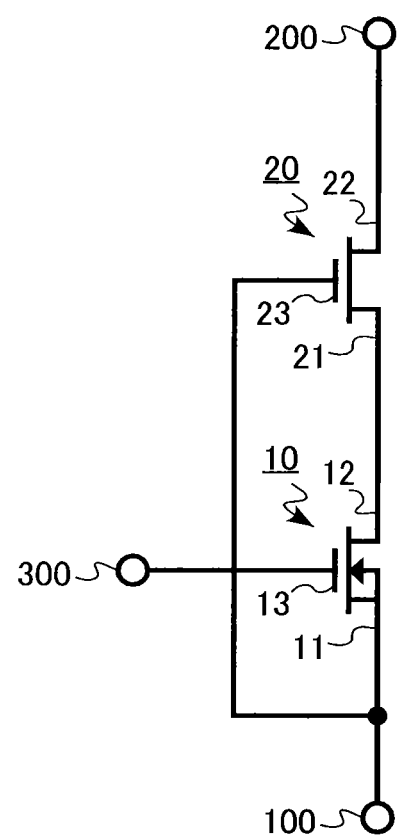
FIG. 2 is a circuit diagram illustrating a semiconductor device according to a comparative example.

FIG. 2 is a circuit diagram illustrating a semiconductor device according to a comparative example. The semiconductor device is also provided with the source terminal 100, the drain terminal 200, and the gate terminal 300. Further, the normally-off transistor 10 includes the first source 11 connected to the source terminal 100, the first drain 12, and the first gate 13 connected to the gate terminal 300. In addition, the normally-on transistor 20 includes the second source 21 connected to the first drain 12, the second drain 22 connected to the drain terminal 200, and the second gate 23 connected to the source terminal 100.

With such a configuration described above, the semiconductor device according to the comparative example also serves as a normally-off transistor which is provided with the source terminal 100, the drain terminal 200, and the gate terminal 300. However, in the configuration of FIG. 2, since the second gate 23 is connected to the source terminal 100, an overdrive voltage, that is, a positive voltage cannot be applied to the gate. When the semiconductor device is turned on, since the second source 21 rises in potential by a voltage expressed by the product of an on-state resistance and a rated current of the normally-off transistor 10, the gate voltage effectively becomes negative. For this reason, there is a concern that a sufficient on-state current does not flow.

In the embodiment, the first gate 13 of the normally-off transistor 10 and the second gate 23 of the normally-on transistor 20 both are connected to the gate terminal 300. Therefore, when the semiconductor device is turned on, the second gate 23 of the normally-on transistor 20 can be applied with an overdrive voltage, that is, a positive voltage. For this reason, a channel resistance at the time of turning on is reduced. Therefore, a large on-state current can be obtained.

In the semiconductor device according to the embodiment, the withstand voltage between the first source 11 and the first drain 12 at the time of turning off the normally-off transistor 10 is lower than that between the second source 21 and the second gate 23 of the normally-on transistor 20. Specifically, an avalanche breakdown voltage of the normally-off transistor 10 is designed to be lower than the withstand voltage of the gate insulating film of the normally-on transistor 20.

The avalanche breakdown voltage of the normally-off transistor 10 is defined by a withstand voltage of a parasitic body diode of the normally-off transistor 10 or a punch-through withstand voltage of a channel portion. The avalanche breakdown voltage of the normally-off transistor 10, for example, can be adjusted by adjusting an impurity concentration or an impurity profile of an impurity layer forming the normally-off transistor 10.

The avalanche breakdown voltage of the normally-off transistor 10 and the withstand voltage of the gate insulating film of the normally-on transistor 20, for example, can be directly evaluated by putting a measurement needle on the electrodes of the normally-off transistor 10 and the normally-on transistor 20.

In a circuit configuration in which the normally-off transistor 10 and the normally-on transistor 20 are connected in series, there is a concern that an overvoltage is generated during the operation in a connection portion between the normally-off transistor 10 and the normally-on transistor 20 (hereinafter, simply referred to as a connection portion), that is, the first drain 12 of the normally-off transistor 10 or the second source 21 of the normally-on transistor 20. For example, when the semiconductor device transitions from the on state to the off state, a high voltage applied between the source terminal 100 and the drain terminal 200 is divided at the ratio of parasitic capacitances of the normally-off transistor 10 and the normally-on transistor 20, so that the overvoltage may be generated. Alternatively, when the semiconductor device is turned off, the high voltage applied between the source terminal 100 and the drain terminal 200 is divided at the ratio of leakage currents of the normally-off transistor 10 and the normally-on transistor 20, so that the overvoltage may be generated.

When the overvoltage is generated, the high voltage is applied between the second source 21 and the second gate 23 of the normally-on transistor 20. When the overvoltage becomes equal to or higher than the withstand voltage of the gate insulating film, there is a concern that the leakage current of the gate insulating film of the normally-on transistor 20 is increased or the gate insulating film is broken down. When the leakage current of the gate insulating film of the normally-on transistor 20 is increased or the gate insulating film is broken down, the semiconductor device malfunctions. Therefore, the semiconductor device is reduced in reliability.

In addition, even in a case where there is no problems in the gate insulating film, when the high voltage is applied between the second source 21 and the second gate 23 of the normally-on transistor 20, electric charges are trapped in the second source 21. For this reason, a current collapse may be caused. When the current collapse occurs, the on-state current is reduced to result in malfunction. Therefore, the semiconductor device is also reduced in reliability.

In the embodiment, the avalanche breakdown voltage of the normally-off transistor 10 is designed to be lower than the withstand voltage of the gate insulating film of the normally-on transistor 20. With this configuration, the withstand voltage between the first source and the first drain at the time of turning off the normally-off transistor becomes lower than the withstand voltage between the second source and the second gate of the normally-on transistor.

Therefore, for example, even in a case where the overvoltage is generated in the connection portion, the electric charges in the connection portion can escape by the generation of the avalanche breakdown of the normally-off transistor 10. Therefore, the voltage applied between the second source 21 and the second gate 23 of the normally-on transistor 20 can be made to be lower than the withstand voltage of the gate insulating film of the normally-on transistor 20. Therefore, an increase in leakage current of the gate insulating film of the normally-on transistor 20 and the breakdown of the gate insulating film are prevented. In addition, the current collapse is also prevented. Therefore, the semiconductor device is improved in reliability.

Further, in general, the withstand voltage of the gate insulating film of the normally-on transistor 20 exceeds 30 V. Therefore, the avalanche breakdown voltage of the normally-off transistor 10 is desirably equal to or lower than 30 V.

In addition, it is desirable that the avalanche breakdown voltage is sufficiently higher than the absolute value of a threshold (Vth) of the normally-on transistor 20. This is because the normally-on transistor 20 can be completely turned off. From this point of view, it is desirable that the avalanche breakdown voltage of the normally-off transistor 10 is [the absolute value of the threshold (Vth) of the normally-on transistor 20]+5 V or higher. For example, in the case of Vth=−10 V, the avalanche breakdown voltage of the normally-off transistor 10 is desirably 15 V or higher.

In addition, the product of the on-state resistance and the rated current of the normally-off transistor 10 is desirably 2 V or lower. With a margin of about 2 V, a gate bias of the normally-on transistor 20 can be sufficiently prevented from being reduced by a voltage drop generated in the normally-off transistor 10. Therefore, it is possible to suppress the current loss caused by the reduction of the gate bias to a minimum.

Second Embodiment

The semiconductor device according to the embodiment is different from the first embodiment in that a level shift element is further provided between the gate terminal and the second gate. The level shift element has a shift voltage. The level shift element makes the voltage on the second gate lowered by an amount of the shift voltage. A redundant description overlapping the first embodiment will be omitted.

Figure 3:
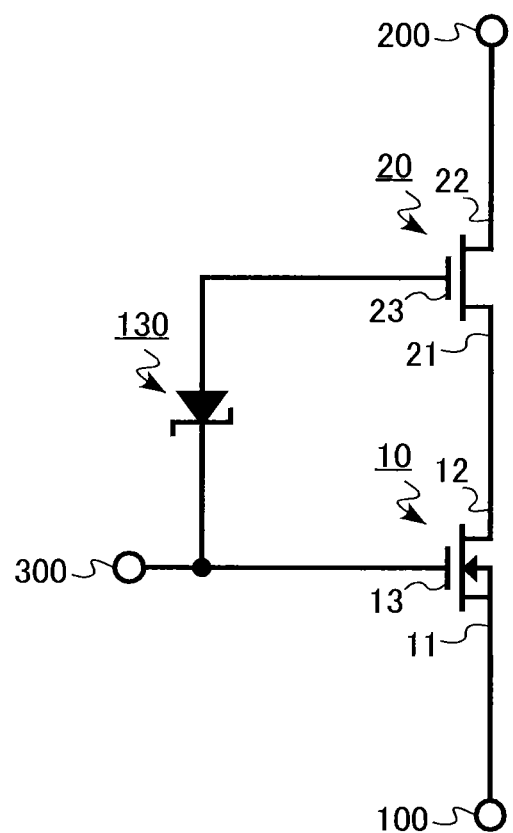
FIG. 3 is a circuit diagram illustrating a semiconductor device according to a second embodiment.

FIG. 3 is a circuit diagram illustrating the semiconductor device according to the embodiment. The semiconductor device according to the embodiment is provided with a level shift element between the gate terminal 300 and the second gate 23 to make the voltage on the second gate 23 lower. In the embodiment, a zener diode (a first zener diode) 130 is provided as the level shift element.

An anode of the zener diode 130 is connected to the second gate 23, and a cathode thereof is connected to the gate terminal 300.

In the embodiment, similarly to the first embodiment, the first gate 13 of the normally-off transistor 10 and the second gate 23 of the normally-on transistor 20 both are connected to the gate terminal 300. Therefore, when the semiconductor device is turned on, the overdrive voltage, that is, a positive voltage can be applied to the second gate 23 of the normally-on transistor 20.

However, when the positive gate voltage applied to the second gate 23 is too high, the gate insulating film of the normally-on transistor 20 is applied with a strong electric field. Therefore, there is a concern that a poor reliability of the gate insulating film is caused. In particular, as described above, since the source of the normally-on transistor 20 does not have a high withstand voltage structure, the poor reliability of the gate insulating film is easily caused. For example, when the voltage applied between the second source 21 and the second gate 23 is 5 V or higher, there is a concern that the poor reliability of the gate insulating film is caused.

In the embodiment, in a case where a positive gate voltage is applied to the gate terminal 300, the voltage applied to the second gate 23 is reduced by a zener voltage of the zener diode 130. Therefore, when the semiconductor device is turned on, the voltage applied between the second source 21 and the second gate 23 is reduced. Therefore, the gate insulating film of the normally-on transistor 20 is improved in reliability.

A shift voltage of the zener diode 130, that is, the zener voltage is desirably smaller than a difference between the gate voltage applied at the time of turning on the normally-off transistor 10, that is, the voltage applied to the gate terminal 300 and the product of the on-state resistance and the rated current of the normally-off transistor 10. Herein, the product of the on-state resistance and the rated current of the normally-off transistor 10 represents the voltage of the first drain 12 and the second source 21 at the time of turning on the semiconductor device.

The on-state resistance of the normally-off transistor 10, for example, can be directly evaluated by putting a measurement needle on the electrode of the normally-off transistor 10.

For example, the voltage applied to the gate terminal 300 is assumed to be 10 V. Then, the on-state resistance (Ron) of the normally-off transistor 10 is assumed to be 0.1Ω, and the rated current (a drain current) thereof is assumed to be 10 A. In this case, the product of the on-state resistance and the rated current of the normally-off transistor 10, that is, the voltage of the first drain 12 and the second source 21 becomes 1 V. Therefore, the zener voltage of the zener diode 130 is desirably lower than 9 V (=10 V−1 V).

By satisfying the above relation, when the semiconductor device is turned on, the overdrive voltage, that is, a positive voltage is securely applied between the second source 21 and the second gate 23 of the normally-on transistor 20. Therefore, the on-state current of the semiconductor device becomes large.

The zener voltage of the zener diode is stable regardless of its operation status and operation circumstances. Therefore, the shift voltage is stable, and thus a stable circuit operation can be realized. In addition, various types of zener diode products are available in a wide range of zener voltages, so that there is an advantage that a desired shift voltage can be realized by one component.

In addition, the zener voltage of the zener diode 130 is desirably higher than a voltage obtained by subtracting 5 V from a difference between the gate voltage applied at the time of turning on the normally-off transistor 10 and the product of the on-state resistance and the rated current of the normally-off transistor 10. The voltage 5 V is a voltage that is allowed for securing the reliability of the gate insulating film.

For example, the voltage applied to the gate terminal 300 is assumed to be 10 V, and the product of the on-state resistance and the rated current of the normally-off transistor 10, that is, the voltage of the first drain 12 and the second source 21 is assumed to be 1 V. In this case, the zener voltage of the zener diode 130 is desirably 4 V (=(10 V−1 V)−5 V) or higher.

By satisfying the above relation, when the semiconductor device is turned on, the voltage applied between the second source 21 and the second gate 23 of the normally-on transistor 20, that is, the voltage applied to the gate insulating film becomes equal to or lower than 5 V. Therefore, the gate insulating film is improved in reliability.

Third Embodiment

The semiconductor device according to the embodiment is different from the first and second embodiments in that the level shift element is a first diode; an anode of the first diode is connected to the gate terminal; a cathode of the first diode is connected on the second gate side; a second diode is provided between the gate terminal and the second gate in parallel with the first diode; an anode of the second diode is connected to the second gate; and a cathode of the second diode is connected to the gate terminal. A redundant description overlapping the first and second embodiments will be omitted.

Figure 4:
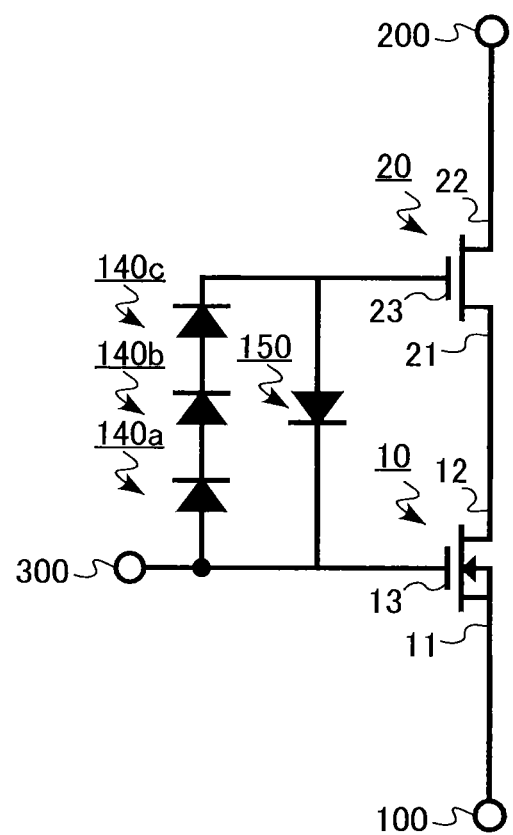
FIG. 4 is a circuit diagram illustrating a semiconductor device according to a third embodiment.

FIG. 4 is a circuit diagram illustrating the semiconductor device according to the embodiment. The semiconductor device according to the embodiment is provided with three diodes (the first diode) 140a, 140b, and 140c, which are connected in series, and a diode (the second diode) 150. In the embodiment, the three diodes 140a, 140b, and 140c serve as the level shift element.

The anode of the three diodes (the first diode) 140a, 140b, and 140c is connected to the gate terminal 300, and the cathode thereof is connected to the second gate 23. Then, the diode (the second diode) 150 is provided between the gate terminal 300 and the second gate 23 in parallel with the three diodes 140a, 140b, and 140c. The anode of the diode 150 is connected to the second gate, and the cathode thereof is connected to the gate terminal 300.

In the embodiment, in a case where a positive gate voltage is applied to the gate terminal 300, the voltage applied to the second gate 23 is reduced by a forward drop voltage (Vf) of the three diodes 140a, 140b, and 140c. Therefore, when the semiconductor device is turned on, the voltage applied between the second source 21 and the second gate 23 is reduced. Therefore, the gate insulating film of the normally-on transistor 20 is improved in reliability.

The voltage applied to the second gate 23 can be adjusted by optimizing the number of diodes connected in series. FIG. 4 illustrates an example in which the number of diodes is three, but the number is not limited thereto.

In a case where the semiconductor device is made to be in the off state, the gate terminal 300 is applied, for example, with 0 V. At this time, the positive electric charges accumulated in the second gate 23 of the normally-on transistor 20 are pulled out to the gate terminal 300 through the diode 150. By providing the diode 150, the switching from the on state to the off state is performed with speed.

The diodes (the first diode) 140a, 140b, and 140c, and the diode (the second diode) 150 are, for example, PIN diodes or schottky-barrier diodes. Having a large forward drop voltage (Vf) compared to the schottky-barrier diode, the PIN diode is desirable in a case where the shift voltage is made to be large. On the other hand, having a high switching speed, the schottky-barrier diode is desirable in a viewpoint of improving a circuit operating speed.

Fourth Embodiment

The semiconductor device according to the embodiment is further provided with a third diode and a second zener diode which are connected in series between the gate terminal and the second source. A cathode of the third diode is connected to the gate terminal, and a cathode of the second zener diode is connected to the second source. The other configurations are similar to those in the first embodiment. Therefore, a redundant description overlapping the first embodiment will be omitted.

Figure 5:
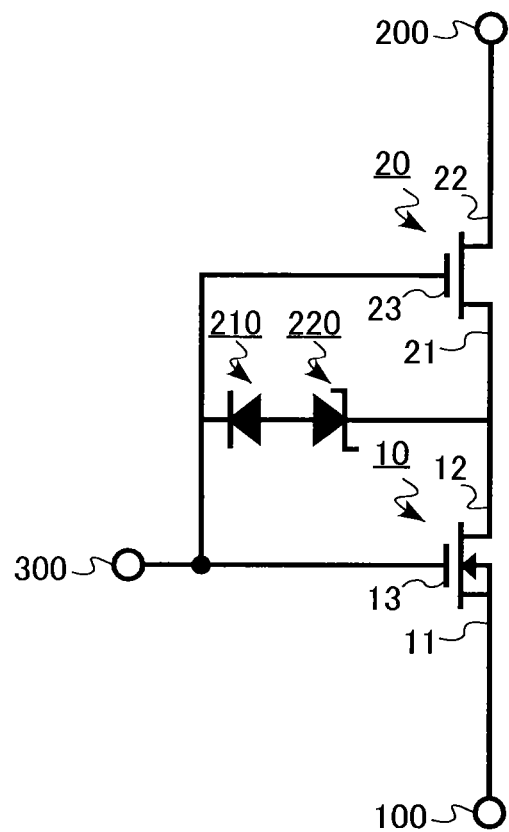
FIG. 5 is a circuit diagram illustrating a semiconductor device according to a fourth embodiment.

FIG. 5 is a circuit diagram illustrating the semiconductor device according to the embodiment. The semiconductor device according to the embodiment is further provided with a diode (the third diode) 210 and a zener diode (the second zener diode) 220 which are connected in series between the gate terminal 300 and the second source 21 of the normally-on transistor 20. Then, the cathode of the diode (the third diode) 210 is connected to the gate terminal 300, and the cathode of the zener diode (the second zener diode) 220 is connected to the second source 21. In addition, an anode of the diode (the third diode) 210 is connected to an anode of the zener diode 220.

As described above, in the circuit configuration in which the normally-off transistor 10 and the normally-on transistor 20 are connected in series, there is a concern that the overvoltage is generated during the operation in the second source 21 of the normally-on transistor 20. In the embodiment, in a case where the overvoltage is generated in the second source 21, a forward current can flow in the diode 210 to cause the voltage of the second source 21 to be reduced. Therefore, the breakdown of the gate insulating film hardly occurs, and the semiconductor device is improved in reliability.

However, when the semiconductor device is turned off, the voltage of the second source 21 is necessarily increased over a certain degree to make the normally-on transistor 20 enter the off state. In the embodiment, by providing the zener diode 220, even when the gate terminal 300 becomes 0 V by making the semiconductor device turned off, the voltage of the second source 21 is increased up to the zener voltage of the zener diode 220. Therefore, it is possible to make the normally-on transistor 20 enter the off state.

According to the embodiment, when the overvoltage is applied to the second source 21, it is possible to directly control the voltage between the second source 21 and the second gate 23 which makes an effect on the reliability of the gate insulating film. Therefore, it is possible to realize the semiconductor device which has a stable characteristic without variations in the reliability.

Further, the diode (the third diode) 210 is, for example, a PIN diode or a schottky-barrier diode.

Fifth Embodiment

The semiconductor device according to the embodiment includes a source field plate (hereinafter, referred to as an SFP) in the normally-on transistor. The other configurations are similar to those in the first embodiment. Therefore, a redundant description overlapping the first embodiment will be omitted.

Figure 6:
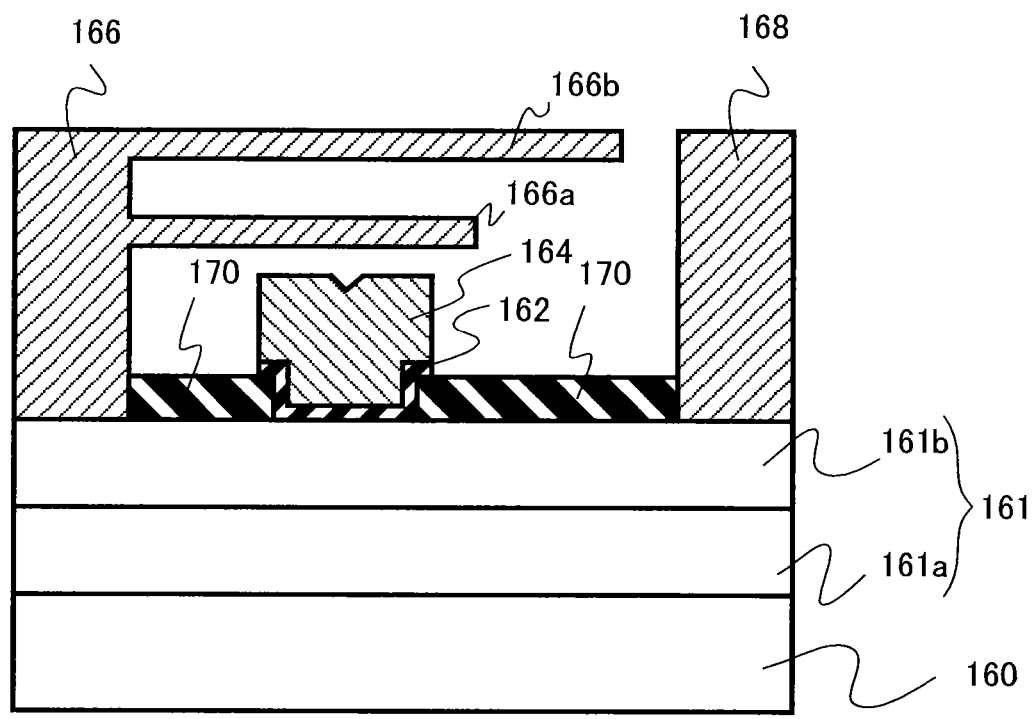
FIG. 6 is a cross-sectional view schematically illustrating a normally-on transistor according to a fifth embodiment.

FIG. 6 is a cross-sectional view schematically illustrating the normally-on transistor according to the embodiment. The normally-on transistor is an HEMT which is made of a GaN (gallium nitride) based semiconductor and is provided with the gate insulating film.

The normally-on transistor 20 (FIG. 1) is formed on a nitride semiconductor layer 161 on a substrate 160. The substrate 160 is, for example, made of silicon (Si).

A buffer layer (not illustrated) is provided between the substrate 160 and the nitride semiconductor layer 161. The buffer layer has a function of buffering a lattice mismatch between the substrate 160 and the nitride semiconductor layer 161. The buffer layer is formed, for example, in a multilayered structure made of aluminum gallium nitride ($Al_xGa_{1-x}N$ ($0<x<1$)).

In addition, the nitride semiconductor layer 161 is provided with a laminated structure of an operating layer (a channel layer) 161a and a barrier layer (an electron supply layer) 161b. The operating layer 161a is, for example, made of gallium nitride (GaN), and the barrier layer 161b is, for example, made of aluminum gallium nitride (AlGaN).

A hetero-junction interface is formed between the operating layer 161a and the barrier layer 161b.

A gate electrode 164 is formed on the nitride semiconductor layer 161 with a first silicon nitride film 162 interposed therebetween. The first silicon nitride film 162 serves as the gate insulating film. The gate electrode 164 is, for example, a metal electrode. The metal electrode is, for example, a nickel (Ni) electrode, a titanium (Ti) electrode, or an aluminum (Al) electrode.

In addition, a source electrode 166 and a drain electrode 168 are formed on the nitride semiconductor layer 161 with the gate electrode 164 interposed therebetween. The source electrode 166 and the drain electrode 168 each are separated from the gate electrode 164.

A second silicon nitride film 170 is formed on the nitride semiconductor layer 161 between the source electrode 166 and the gate electrode 164 and between the drain electrode 168 and the gate electrode 164. The second silicon nitride film 170 is formed on the surface of the nitride semiconductor layer 161 in contact with each other. The second silicon nitride film 170 serves as a surface protection film (or a passivation film) which protects the surface of the nitride semiconductor layer 161 between the gate electrode 164 and the source electrode 166 and between the gate electrode 164 and the drain electrode 168.

The source electrode 166 is provided with two-stage source field plate portions 166a and 166b which are extended to the drain electrode 168 over the second silicon nitride film 170. The source field plate portions 166a and 166b serve as the source field plates when the normally-on transistor 20 is turned on.

The source field plate portions 166a and 166b have a function of weakening the electric field in a source region between the source electrode 166 and the gate electrode 164 and a drain region between the gate electrode 164 and the drain electrode 168 so as to suppress the current collapse. As a structure serving the same function above, there is a gate field plate (hereinafter, referred to as a GFP) in which the gate electrode 164 is made to be extended to the drain electrode 168.

In general, the transistor desirably has a small parasitic capacitance from a viewpoint of avoiding a decrease in the operating speed and an increase in loss. Specifically, having a great influence on the parasitic oscillation and the switching speed, a gate-drain capacitance (Cgd) is desirably made small.

Therefore, in the semiconductor device according to the embodiment, that is, the configuration in which the normally-off transistor 10 and the normally-on transistor 20 are directly connected and share their gate electrodes in common, the SFP of which the gate-drain capacitance (Cgd) becomes small is more desirable than the GFP as a structure for realizing a decrease in collapse.

According to the embodiment, in addition to the improvement effect of reliability similarly to the first embodiment, it is possible to suppress the current collapse by using the SFP to control a parasitic capacitance which affects the device characteristics. Therefore, the semiconductor device more improved in reliability is realized.

Further, the description has been made about the SFP having the structure in which the source electrode 166 itself is extended to the drain. However, for example, an SFP electrode having the same potential as the source electrode 166 may be provided independently of the source electrode 166. In addition, the number of source field plate portions is not limited to two, but there may be provided by one or three or more.

Sixth Embodiment

The semiconductor device according to the embodiment is further provided with the substrate, a source lead wire, a drain lead wire, and a gate lead wire. Then, the normally-off transistor, the normally-on transistor, and the zener diode are mounted on the substrate. The normally-off transistor and the normally-on transistor are arranged in this order from the source lead wire toward the drain lead wire. In addition, the first zener diode and the normally-on transistor are arranged in this order from the source lead wire toward the drain lead wire. Furthermore, the source lead wire is connected to the first source, the drain lead wire is connected to the second drain, and the gate lead wire is connected to the first gate and the cathode of the first zener diode.

The embodiment is an example of a power module obtained by embodying the circuit configuration according to the second embodiment. Hereinafter, a redundant description overlapping the second embodiment will be omitted.

Figure 7:
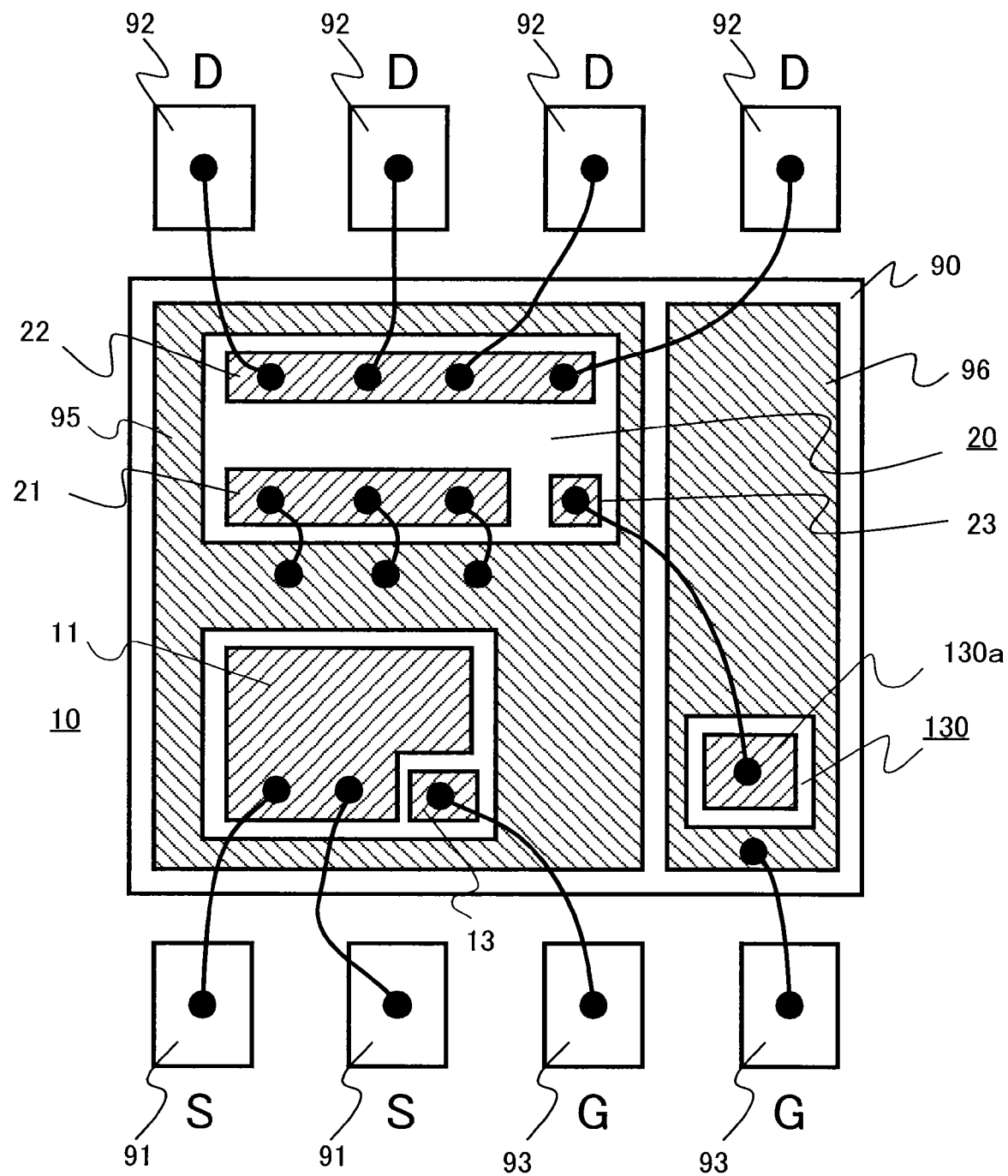
FIG. 7 is a diagram schematically illustrating a semiconductor device in upper view according to a sixth embodiment.

FIG. 7 is a diagram schematically illustrating the semiconductor device in upper view according to the embodiment.

The semiconductor device according to the embodiment is provided with a substrate 90, a source lead wire 91, a drain lead wire 92, and a gate lead wire 93. The source lead wire 91 corresponds to the source terminal 100, the drain lead wire 92 corresponds to the drain terminal 200, and the gate lead wire 93 corresponds to the gate terminal 300.

At least the surface of the substrate 90, for example, includes a first conductor 95 and a second conductor 96 which are made of metal. The first conductor 95 and the second conductor 96 are physically separated from each other.

The normally-off transistor 10 and the normally-on transistor 20 are mounted on the first conductor 95 on the substrate 90. In addition, the zener diode 130 is mounted on the second conductor 96 on the substrate 90. The normally-off transistor 10, the normally-on transistor 20, and the zener diode 130 are, for example, semiconductor chips which are mounted on the first and second conductors 95 and 96 of the substrate using, for example, conductive paste or solder.

Then, the normally-off transistor 10 and the normally-on transistor 20 are arranged in this order from the source lead wire 91 toward the drain lead wire 92. In addition, the zener diode 130 and the normally-on transistor 20 are arranged in this order from the source lead wire 91 of the substrate 90 toward the drain lead wire 92.

Then, the source lead wire 91 is connected to the first source 11 of the normally-off transistor 10. Then, the drain lead wire 92 is connected to the second drain 22. The gate lead wire 93 is connected to the first gate 13 and the second conductor 96 which has the same potential as the cathode of the zener diode 130.

In addition, an anode 130a of the zener diode 130 is connected to the second gate 23 of the normally-on transistor 20. Then, the first conductor 95 having the same potential as the first drain of the normally-off transistor 10 is connected to the second source 21 of the normally-on transistor 20.

The respective connections are, for example, made by wire bonding. In the wire bonding, for example, materials such as copper (Cu) and aluminum (Al) are used.

According to the embodiment, the normally-off transistor 10 and the normally-on transistor 20 are arranged in this order from the source lead wire 91 toward the drain lead wire 92. Therefore, it is possible to shorten the flowing path of the on-state current of the semiconductor device. With such an arrangement, parasitic inductance on the path of the on-state current is excluded as low as possible, so that conduction loss is reduced.

Hitherto, according to the embodiment, in addition to the advantage of the second embodiment, it is possible to realize the semiconductor device having excellent characteristics by appropriately arranging and connecting the respective devices.

In the embodiment, a distance between the zener diode 130 and the normally-on transistor 20 is desirably made longer than that between the normally-off transistor 10 and the normally-on transistor 20. In general, a diode is easily influenced by heat compared to a transistor. Then, the normally-on transistor 20 has a large heating value for the large power consumption. Therefore, the zener diode 130 is disposed away from the normally-on transistor 20, and thus it is possible to suppress a variation in characteristics due to the heating of the semiconductor device.

Seventh Embodiment

The semiconductor device according to the embodiment is different from the first embodiment in that there is further provided a third zener diode of which the anode is connected to the first source and the cathode is connected to the first drain and the second source. Then, the zener voltage of the third zener diode is lower than the avalanche breakdown voltage of the normally-off transistor. A redundant description overlapping the first embodiment will be omitted.

Figure 8:
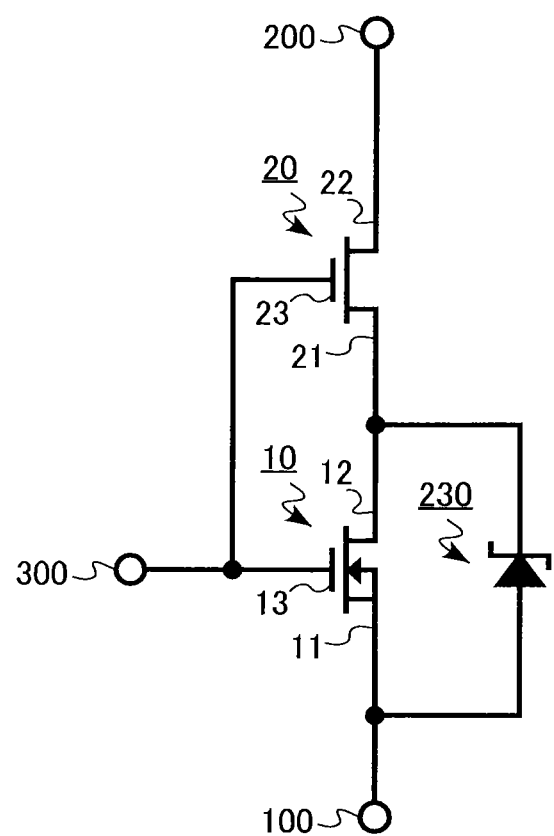
FIG. 8 is a circuit diagram illustrating a semiconductor device according to a seventh embodiment.

FIG. 8 is a circuit diagram illustrating the semiconductor device according to the embodiment. The semiconductor device according to the embodiment is provided with a zener diode (the third zener diode) 230 in parallel with the normally-off transistor 10.

The anode of the zener diode 230 is connected to the first source 11. In addition, the cathode is connected to the first drain 12 and the second source 21.

The zener voltage of the zener diode 230 is set to be lower than the avalanche breakdown voltage of the normally-off transistor 10. In addition, the zener voltage is set to be lower than the withstand voltage of the gate insulating film of the normally-on transistor 20. With this configuration, the withstand voltage between the first source 11 and the first drain 12 at the time of turning off the normally-off transistor 10 becomes lower than the withstand voltage between the second source 21 of the normally-on transistor 20 and the second gate 23.

In the semiconductor device according to the embodiment, in a case where the overvoltage is generated in the connection portion between the normally-off transistor 10 and the normally-on transistor 20, the electric charges escape to the zener diode 230 and are pulled out to the source terminal 100 at the time when the overvoltage reaches the zener voltage. Therefore, a voltage rise in the connection portion is suppressed, and an increase in the leakage current of the gate insulating film of the normally-on transistor 20 and the breakdown of the gate insulating film are prevented. In addition, also the current collapse is prevented. Therefore, the semiconductor device is improved in reliability.

The zener voltage of the zener diode 230 can be controlled with accuracy compared to the avalanche breakdown voltage of the normally-off transistor 10. Therefore, the semiconductor device according to the embodiment becomes more stable than that of the first embodiment by using the zener diode 230, and the overvoltage in the connection portion can be suppressed. In addition, even in a case where an unexpected high voltage such as noises or the like is applied to the first drain 12 of the normally-off transistor 10, the electric charges can escape through the zener diode 230, so that it will also contribute to the protection of the normally-off transistor 10.

Eighth Embodiment

The semiconductor device according to the embodiment is different from the seventh embodiment in that there are further provided a fourth diode and a capacitor. The fourth diode is provided between the first drain and the third zener diode, and includes an anode connected to the first drain and a cathode connected to the cathode of the third zener diode. The capacitor is provided between the cathode of the third zener diode and the first source in parallel with the third zener diode. A redundant description overlapping the seventh embodiment will be omitted.

Figure 9:
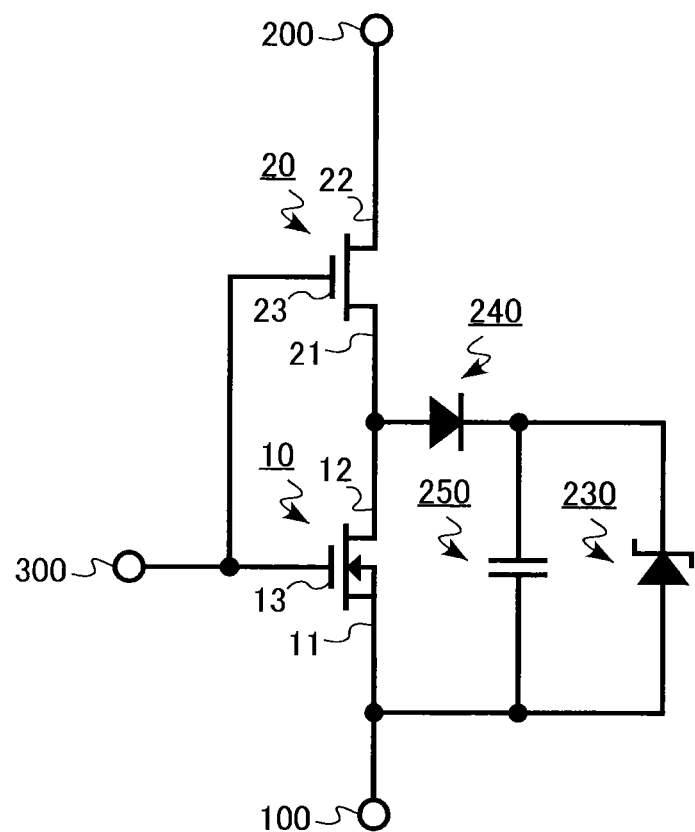
FIG. 9 is a circuit diagram illustrating a semiconductor device according to an eighth embodiment.

FIG. 9 is a circuit diagram illustrating the semiconductor device according to the embodiment. The semiconductor device according to the embodiment is provided with a diode (the fourth diode) 240 on the drain side of the normally-off transistor 10. Then, the zener diode (the third zener diode) 230 is provided in parallel with the normally-off transistor 10. Further, a capacitor 250 is provided in parallel with the zener diode (the third zener diode) 230.

The diode 240 is provided between the first drain 12 and the second source 21, and the zener diode 230. The anode of the diode 240 is connected to the first drain 12 and the second source 21. In addition, the cathode of the diode 240 is connected to the cathode of the zener diode 230.

In addition, the capacitor 250 is provided between the cathode of the diode 240 and the cathode of the zener diode 230, and the first source 11 in parallel with the zener diode 230.

The diode 240 serves to prevent the counterflow of electric charges from the capacitor 250. The diode 240 is, for example, a PIN diode or a schottky-barrier diode.

According to the embodiment, in a case where the overvoltage is generated in the connection portion between the normally-off transistor 10 and the normally-on transistor 20, the electric charges are once accumulated in the capacitor 250. Then, the accumulated electric charges escape to the source terminal 100 through the zener diode 230. With this configuration, a voltage rise in the connection portion is suppressed, and an increase in the leakage current of the gate insulating film of the normally-on transistor 20 and the breakdown of the gate insulating film are prevented. In addition, also the current collapse is prevented. Therefore, the semiconductor device is improved in reliability.

In the embodiment, since the electric charges are once accumulated in the capacitor 250, the zener diode 230 can be an inexpensive diode having a small parasitic capacitance. Therefore, the semiconductor device can be realized at a low cost.

In addition, the capacitance of the capacitor 250 is connected to the capacitance of the diode 240 in series between the first source 11 and the second source 21 of the normally-off transistor 10. In addition, the diode 240 can be selected among diode products having an extremely small parasitic capacitance compared to the case where only the zener diode is provided. Therefore, the capacitance of the diode 240 is made sufficiently smaller than that of the capacitor 250, so that the capacitance of the capacitor 250 contributes less to the parasitic capacitance of the normally-off transistor 10. Therefore, it is possible to suppress a decrease in the operating speed of the normally-off transistor 10 and an increase in loss due to the increase in parasitic capacitance.

In addition, the zener diode 230 can be reduced in size by providing the capacitor 250 compared to the configuration of the seventh embodiment in which only the zener diode is provided. With this configuration, the leakage current of the zener diode 230 can be reduced. Therefore, the semiconductor device having low power consumption is realized.

In addition, a required response time to the zener diode 230 is alleviated by providing the capacitor 250. Therefore, the zener diode 230 can be disposed away from the normally-on transistor 20 which is a heat source. Therefore, it is possible to suppress that the zener diode 230 rises high in temperature and varies in its characteristics.

Ninth Embodiment

The semiconductor device according to the embodiment is different from the semiconductor device according to the seventh embodiment in that there is provided a schottky-barrier diode of which the anode is connected to the first source and the cathode is connected to the first drain. The schottky-barrier diode has a forward drop voltage lower than the forward drop voltage of a parasitic body diode of the normally-off transistor, and is provided between the first source and the first drain in parallel with the third zener diode. Hereinafter, a redundant description overlapping the seventh embodiment will be omitted.

Figure 10:
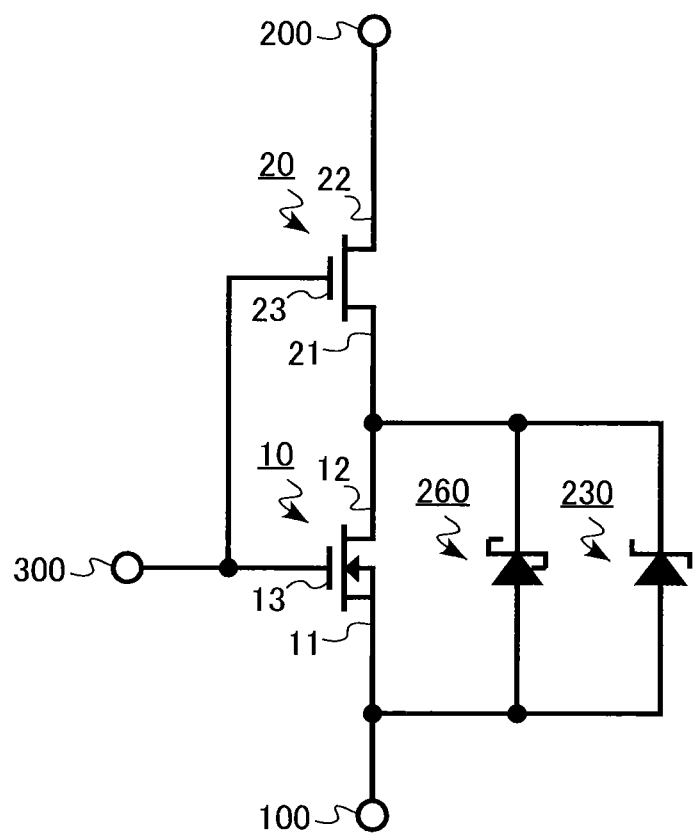
FIG. 10 is a circuit diagram illustrating a semiconductor device according to a ninth embodiment.

FIG. 10 is a circuit diagram illustrating the semiconductor device according to the embodiment. The semiconductor device according to the embodiment is provided with the zener diode (the third zener diode) 230 in parallel with the normally-off transistor 10. Further, a schottky-barrier diode 260 is provided in parallel with the zener diode 230.

The anode of the schottky-barrier diode 260 is connected to the first source 11. In addition, the cathode of the schottky-barrier diode 260 is connected to the first drain 12 and the second source 21.

The forward drop voltage (Vf) of the schottky-barrier diode 260 is lower than the forward drop voltage (Vf) of a parasitic body diode (not illustrated) of the normally-off transistor. Then, the schottky-barrier diode 260 is provided between the first drain 12 and the second source 21, and the first source 11 in parallel with the zener diode (the third zener diode) 230.

Similarly to the seventh embodiment, in a case where the schottky-barrier diode 260 is not provided, the current flows through a parasitic body diode of the normally-off transistor 10 in a reflux mode in which the source terminal 100 becomes positive in voltage with respect to the drain terminal 200. In the embodiment, there is provided the schottky-barrier diode 260 of which the forward drop voltage (Vf) is lower than the forward drop voltage (Vf) of the parasitic body diode of the normally-off transistor 10. Therefore, the current flows through the schottky-barrier diode 260 in the reflux mode.

The schottky-barrier diode operates using only a number of carriers unlike the PIN diode. Therefore, the schottky-barrier diode has an excellent recovery characteristic compared to the PIN diode. Thus, in the embodiment, the recovery characteristic can be improved in the reflux mode in addition to the advantage of the seventh embodiment. Accordingly, it is possible to realize the semiconductor device which is excellent in the reliability and the recovery characteristic. Since the greater part of the withstand voltage is burdened on the normally-on transistor 20, the schottky-barrier diode 260 can be realized by employing a product having a lower withstand voltage. With this configuration, it is possible to achieve a body diode operation of a high withstand voltage while maintaining the same forward drop voltage (Vf) characteristic and the same recovery characteristic as the low withstand voltage product.

In addition, since the forward drop voltage (Vf) is small, the conduction loss and the switching loss can also be reduced in the reflux mode. In addition, the overvoltage is suppressed from being applied to the connection portion by a parasitic capacitance of the schottky-barrier diode 260. In addition, since the electric charges can escape from the connection portion by the leakage current of the schottky-barrier diode 260, the overvoltage is suppressed from being applied to the connection portion. Therefore, the semiconductor device more improved in reliability is realized.

Further, since the schottky-barrier diode has no guarantee against the avalanche breakdown, the withstand voltage of the schottky-barrier diode 260 is desirably higher than the avalanche breakdown voltage of the normally-off transistor 10.

Tenth Embodiment

The semiconductor device according to the embodiment is provided with the normally-off transistor which includes the first source connected to the source terminal, the first drain, and the first gate connected to the gate terminal, the normally-on transistor which includes the second source connected to the first drain, the second drain connected to the drain terminal, and the second gate connected to the gate terminal, and the zener diode of which the anode is connected to a discharge terminal and the cathode is connected to the first drain. The zener voltage of the zener diode is lower than the withstand voltage between the second source and the second gate of the normally-on transistor. Further, the zener voltage of the zener diode is lower than the avalanche breakdown voltage of the normally-off transistor.

Figure 11:
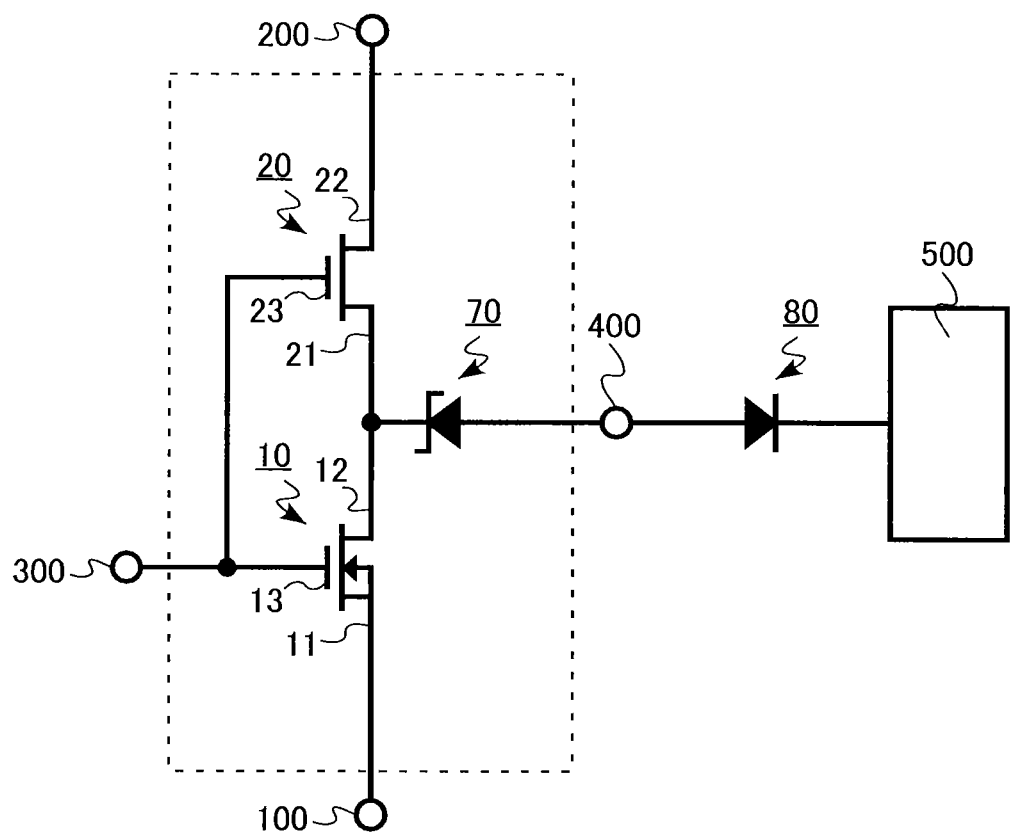
FIG. 11 is a circuit diagram illustrating a semiconductor device according to a tenth embodiment.

FIG. 11 is a circuit diagram illustrating the semiconductor device according to the embodiment. The semiconductor device according to the embodiment is similar to the first embodiment in that the normally-off transistor 10 and the normally-on transistor 20 are connected in series to form the power module. Hereinafter, a redundant description overlapping the first embodiment will be omitted.

The semiconductor device according to the embodiment is provided with the source terminal 100, the drain terminal 200, the gate terminal 300, and a discharge terminal 400. Then, the normally-off transistor 10 includes the first source 11 connected to the source terminal 100, the first drain 12, and the first gate 13 connected to the gate terminal 300. In addition, the normally-on transistor 20 includes the second source 21 connected to the first drain 12, the second drain 22 connected to the drain terminal 200, and the second gate 23 connected to the gate terminal 300.

Further, there is provided a zener diode 70 of which the zener voltage is lower than the withstand voltage between the second source and the second gate of the normally-on transistor 20. In addition, the zener voltage is lower than the avalanche breakdown voltage of the normally-off transistor 10.

The anode of the zener diode 70 is connected to the discharge terminal 400. The cathode of the zener diode 70 is connected to the first drain 12 and the second source 21.

In addition, the discharge terminal 400 is connected to a power source 500 through a diode 80. The diode 80 is, for example, a PIN diode. The power source 500 is, for example, a power source of a control circuit which controls the normally-off transistor 10 and the normally-on transistor 20 which are connected in series.

The anode of the diode 80 is connected to the discharge terminal 400. In addition, the cathode of the diode 80 is connected to the power source 500. The diode 80 suppresses the current from flowing from the power source 500 to the connection portion.

According to the embodiment, in a case where the overvoltage is generated in the connection portion between the normally-off transistor 10 and the normally-on transistor 20, the electric charges escape to the zener diode 70 and are pulled out to the discharge terminal 400 at the time when the overvoltage reaches the zener voltage. Therefore, a voltage rise in the connection portion is suppressed, and an increase in the leakage current of the gate insulating film of the normally-on transistor 20 and the breakdown of the gate insulating film are prevented. In addition, also the current collapse is prevented. Therefore, the semiconductor device is improved in reliability. In addition, the electric charges, which are generated in the connection portion by the overvoltage, are input to the power source 500 for regeneration. Therefore, power saving is realized all over the semiconductor device system.

Further, the zener voltage is desirably optimized depending on the voltage value of the power source 500 and the voltage value allowed to the connection portion. For example, in a case where the voltage of the power source 500 is 5 V and the voltage allowed to the connection portion is 20 V, the zener voltage may be adjusted to be about 15 V.

Eleventh Embodiment

The semiconductor device according to the embodiment is similar to the tenth embodiment except that a diode is further provided between the zener diode and the discharge terminal. The anode of the diode is connected to the anode of the zener diode, and the cathode thereof is connected to the discharge terminal. Hereinafter, a redundant description overlapping the tenth embodiment will be omitted.

Figure 12:
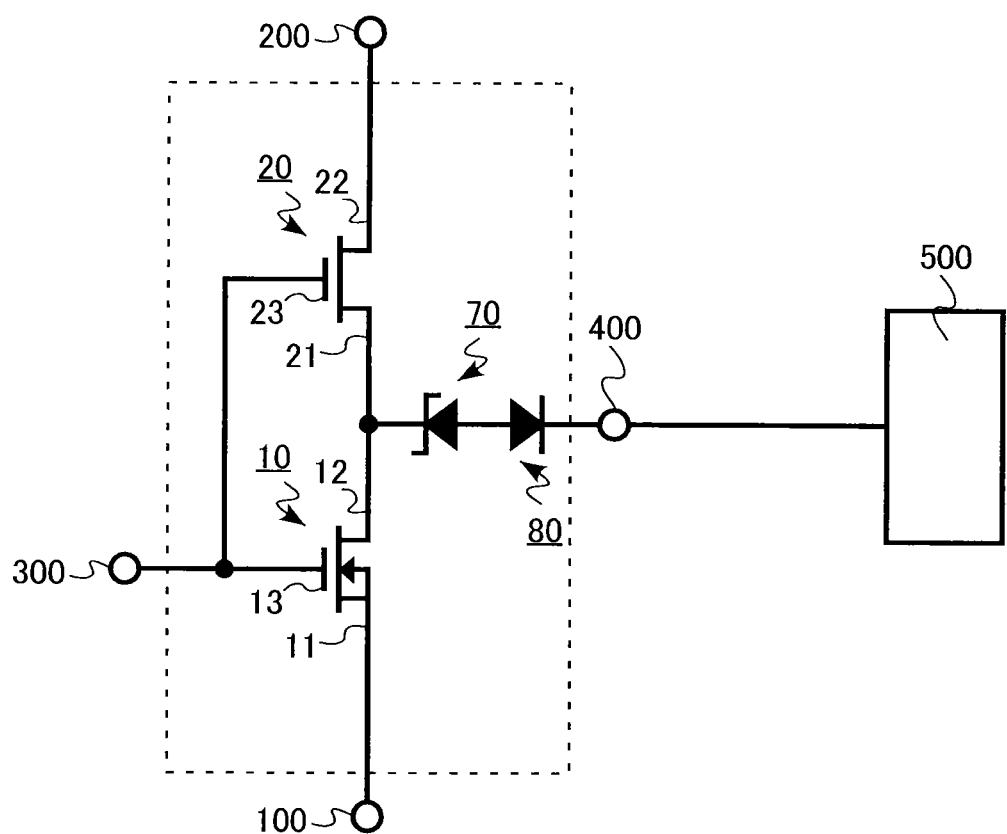
FIG. 12 is a circuit diagram illustrating a semiconductor device according to an eleventh embodiment.

FIG. 12 is a circuit diagram illustrating the semiconductor device according to the embodiment.

The semiconductor device according to the embodiment is provided with the diode 80 between the discharge terminal 400 and the zener diode 70 unlike the tenth embodiment. For example, the area in a dotted frame of FIG. 12 can be made in one semiconductor package.

Also in the embodiment, the same advantage as the tenth embodiment can be obtained. Further, since the diode 80 for preventing the counterflow is mounted in the semiconductor package, the system can be realized in compact size.

Hitherto, the embodiments have been described about the vertical MOSFET made of Si (silicon) which is given as an example of the normally-off transistor 10, and about N-ch HEMT made of the GaN (gallium nitride) based semiconductor which is given as an example of the normally-on transistor 20. However, the normally-off transistor 10 and the normally-on transistor 20 are not limited these components.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a normally-off transistor including a first source connected to a source terminal, a first drain, a first gate connected to a gate terminal;
a normally-on transistor including a second source connected to the first drain, a second drain connected to a drain terminal, and a second gate connected to the gate terminal; and
a level shift element provided between the gate terminal and the second gate, the level shift element having a shift voltage, the level shift element configured to lower a voltage on the second gate by an amount of the shift voltage,
wherein
the shift voltage of the level shift element is smaller than a difference between a gate voltage applied to the gate terminal at a time of turning on the normally-off transistor and the product of an on-state resistance and a rated current of the normally-off transistor.

2. The device according to claim 1, wherein
the level shift element is a first zener diode,
an anode of the first zener diode is connected to the second gate, and
a cathode of the first zener diode is connected to the gate terminal.

3. The device according to claim 2, further comprising:
a substrate;
a source lead wire;
a drain lead wire; and
a gate lead wire, wherein
the normally-off transistor and the normally-on transistor are arranged in this order on the substrate from the source lead wire toward the drain lead wire,
the first zener diode and the normally-on transistor are arranged in this order on the substrate from the source lead wire toward the drain lead wire,
the source lead wire is connected to a first source,
the drain lead wire is connected to the second drain, and
the gate lead wire is connected to the first gate and the cathode of the first zener diode.

4. The device according to claim 1, wherein
the normally-on transistor is a HEMT formed of GaN based semiconductor.

5. The device according to claim 1, wherein
the normally-off transistor is a vertical MOSFET formed of Si.

6. The device according to claim 1, wherein
a withstand voltage between the first source and the first drain at the time of turning off the normally-off transistor is lower than a withstand voltage between the second source and the second gate of the normally-on transistor.

7. A semiconductor device comprising:
a normally-off transistor including a first source connected to a source terminal, a first drain, a first gate connected to a gate terminal;
a normally-on transistor including a second source connected to the first drain, a second drain connected to a drain terminal, and a second gate connected to the gate terminal, and
a level shift element provided between the gate terminal and the second gate, the level shift element having a shift voltage, the level shift element configured to lower a voltage on the second gate by an amount of the shift voltage,
wherein
the level shift element is a first diode,
an anode of the first diode is connected to the gate terminal,
a cathode of the first diode is connected to the second gate,
a second diode is provided between the gate terminal and the second gate in parallel with the first diode,
an anode of the second diode is connected to the second gate, and
a cathode of the second diode is connected to the gate terminal.

8. A semiconductor device comprising:
a normally-off transistor including a first source connected to a source terminal, a first drain, a first gate connected to a gate terminal;
a normally-on transistor including a second source connected to the first drain, a second drain connected to a drain terminal, and a second gate connected to the gate terminal, and
a level shift element provided between the gate terminal and the second gate, the level shift element having a shift voltage, the level shift element configured to lower a voltage on the second gate by an amount of the shift voltage,
wherein
the shift voltage of the level shift element is higher than a voltage obtained by subtracting 5 V from a difference between a gate voltage applied to the gate terminal at the time of turning on the normally-off transistor and the product of an on-state resistance and a rated current of the normally-off transistor.

9. A semiconductor device comprising:
a normally-off transistor including a first source connected to a source terminal, a first drain, a first gate connected to a gate terminal;
a normally-on transistor including a second source connected to the first drain, a second drain connected to a drain terminal, and a second gate connected to the gate terminal;
a third diode; and
a second zener diode, wherein
the third diode and the second zener diode are connected in series between the gate terminal and the second source,
a cathode of the third diode is connected to the gate terminal, and
a cathode of the second zener diode is connected to the second source.

10. A semiconductor device comprising:
a normally-off transistor including a first source connected to a source terminal, a first drain, a first gate connected to a gate terminal; and
a normally-on transistor including a second source connected to the first drain, a second drain connected to a drain terminal, and a second gate connected to the gate terminal, wherein
the normally-on transistor is a HEMT formed of GaN based semiconductor and the normally-on transistor includes a source field plate.

11. A semiconductor device comprising:
a normally-off transistor including a first source connected to a source terminal, a first drain, a first gate connected to a gate terminal;
a normally-on transistor including a second source connected to the first drain, a second drain connected to a drain terminal, and a second gate connected to the gate terminal; and a third zener diode including an anode connected to the first source and a cathode connected to the first drain and the second source, wherein
a zener voltage of the third zener diode is lower than an avalanche breakdown voltage of the normally-off transistor.

12. The device according to claim 11, further comprising:
a fourth diode provided between the first drain and the third zener diode and includes an anode connected to the first drain and a cathode connected to the third zener diode; and
a capacitor which is provided between a cathode of the fourth diode and the first source in parallel with the third zener diode.

13. The device according to claim 11, further comprising a schottky-barrier diode including an anode connected to the first source and a cathode connected to the first drain, wherein
a forward drop voltage of the schottky-barrier diode is lower than a forward drop voltage of a parasitic body diode of the normally-off transistor, and
the schottky-barrier diode is provided between the first source and the first drain in parallel with the third zener diode.

14. A semiconductor device comprising:
a normally-off transistor which includes a first source connected to a source terminal, a first drain, a first gate connected to a gate terminal;
a normally-on transistor which includes a second source connected to the first drain, a second drain connected to a drain terminal, and a second gate connected to the gate terminal; and
a zener diode which includes an anode connected to a discharge terminal and a cathode connected to the first drain, wherein
a zener voltage of the zener diode is lower than a withstand voltage between the second source and the second gate of the normally-on transistor, and
the zener voltage is lower than an avalanche breakdown voltage of the normally-off transistor.

15. The device according to claim 14, further comprising a level shift element provided between the gate terminal and the second gate, the level shift element having a shift voltage, the level shift element configured to lower a voltage on the second gate by an amount of the shift voltage.

16. The device according to claim 15, wherein
the shift voltage of the level shift element is smaller than a difference between a gate voltage applied to the gate terminal at the time of turning on the normally-off transistor and the product of an on-state resistance and a rated current of the normally-off transistor.

17. The device according to claim 14, further comprising a diode provided between the zener diode and the discharge terminal, the diode including an anode connected to the anode of the zener diode and a cathode connected to the discharge terminal.

18. The device according to claim 14, wherein the discharge terminal is connected to a power source.

* * * * *